United States Patent
Wen et al.

(10) Patent No.: US 8,888,254 B2
(45) Date of Patent: Nov. 18, 2014

(54) HIGH DENSITY THREE-DIMENSIONAL ELECTRICAL INTERCONNECTIONS

(75) Inventors: Xuejin Wen, Fairport, NY (US); Peter J. Nystrom, Webster, NY (US); Gary D. Redding, Victor, NY (US); Jun Ma, Penfield, NY (US)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 13/614,879

(22) Filed: Sep. 13, 2012

(65) Prior Publication Data

US 2014/0071208 A1    Mar. 13, 2014

(51) Int. Cl.
   *B41J 2/045*    (2006.01)
(52) U.S. Cl.
   USPC .......................................................... 347/68
(58) Field of Classification Search
   None
   See application file for complete search history.

(56) References Cited

U.S. PATENT DOCUMENTS

| | | | |
|---|---|---|---|
| 6,158,847 A * | 12/2000 | Usui et al. | 347/70 |
| 6,166,436 A * | 12/2000 | Maeda et al. | 257/723 |
| 7,310,869 B2 | 12/2007 | Nakayama | |
| 7,320,603 B2 | 1/2008 | Nakayama | |
| 7,358,643 B2 | 4/2008 | Sugahara | |
| 7,413,291 B2 | 8/2008 | Ito | |
| 7,478,896 B2 | 1/2009 | Ito | |
| 7,527,356 B2 | 5/2009 | Sato | |
| 7,562,428 B2 | 7/2009 | Shinkai | |
| 7,571,993 B2 | 8/2009 | Ito | |
| 7,581,825 B2 | 9/2009 | Watanabe | |
| 7,637,599 B2 | 12/2009 | Ota | |
| 7,682,000 B2 | 3/2010 | Sugahara | |
| 7,694,398 B2 | 4/2010 | Enomoto | |
| 7,722,164 B2 * | 5/2010 | Watanabe et al. | 347/70 |
| 8,020,967 B2 | 9/2011 | Hiwada | |
| 8,104,877 B2 | 1/2012 | Kajiura | |
| 2004/0104981 A1 * | 6/2004 | Fujii et al. | 347/71 |
| 2008/0049077 A1 | 2/2008 | Sugahara | |
| 2008/0316255 A1 | 12/2008 | Kubo | |
| 2010/0177146 A1 | 7/2010 | Takemura | |
| 2010/0245482 A1 | 9/2010 | Yamashita | |
| 2011/0007117 A1 | 1/2011 | Bibl | |
| 2011/0018943 A1 | 1/2011 | Owaki | |
| 2011/0050809 A1 | 3/2011 | Takahashi | |
| 2011/0074891 A1 | 3/2011 | Ito | |
| 2011/0115852 A1 | 5/2011 | Bibl | |
| 2011/0128328 A1 | 6/2011 | Kobayashi | |
| 2011/0134191 A1 | 6/2011 | Kajiura | |
| 2011/0199437 A1 | 8/2011 | Miyata | |
| 2011/0205270 A1 | 8/2011 | Miyata | |
| 2011/0205308 A1 | 8/2011 | Miyata | |
| 2011/0226807 A1 | 9/2011 | Essen | |
| 2011/0242163 A1 | 10/2011 | Yamashita | |
| 2011/0298871 A1 | 12/2011 | Stephens | |

\* cited by examiner

*Primary Examiner* — Matthew Luu
*Assistant Examiner* — Erica Lin
(74) *Attorney, Agent, or Firm* — MH2 Technology Law Group LLP

(57) ABSTRACT

Implementations relate to methods, devices produced by the method, and systems using the devices, for forming three-dimensional interconnect structures for ink piezoelectric printheads. A piezoelectric element array for an ink jet print head can include a plurality of piezoelectric elements spaced from adjacent piezoelectric elements by an interstitial space. Each piezoelectric element can include a central void space formed in a first intermediate layer between the piezoelectric element array and a second intermediate layer that is operable to function as a free space for portions of the piezoelectric elements to actuate into when subjected to the voltage.

8 Claims, 10 Drawing Sheets

HIGH DENSITY THREE-DIMENSIONAL ELECTRICAL INTERCONNECTIONS

FIELD

The present teachings relate to the field of ink jet printing devices and, more particularly, to methods and structures for high density piezoelectric ink jet print heads and a printer including a high density piezoelectric ink jet print head.

BACKGROUND

Drop on demand ink jet technology is widely used in the printing industry. Printers using drop on demand ink jet technology can use either thermal ink jet technology or piezoelectric technology. Even though they are more expensive to manufacture than thermal ink jets, piezoelectric ink jets are generally favored, for example because they can use a wider variety of inks.

In solid inkjet printing technology, ink, in solid form, is heated to a printing temperature and ejected from a printhead nozzle by a plurality of ejectors (actuators). The ink can be deposited, for example, directly onto a print medium or onto a media transfer device such as a heated rotating drum which transfers the ink through physical contact with the print medium.

To provide suitable print quality using solid inkjet printers, it is desirable to dispense ink from the ejectors at a temperature which is within a few degrees of a target temperature. The target temperature for solid ink can be between about 105° C. and 140° C. The temperature of the melted ink can be maintained by heating the printhead with a heated mass such as a flexible polyimide thin film layer with metal traces of gold or copper on the polyimide surface. The heater is assembled using adhesive layers, and heats the printhead which transfers the heat through contact with the ink as it flows through channels in the printhead.

Piezoelectric ink jet print heads include an array of piezoelectric elements (i.e., transducers or PZTs), where the array includes an interspatial gap between adjacent piezoelectric elements to provide the correct spacing between each piezoelectric element. Piezoelectric ink jet print heads can typically further include a flexible diaphragm to which the array of piezoelectric elements is attached. When a voltage is applied to a piezoelectric element, typically through electrical connection with an electrode electrically coupled to a power source, the piezoelectric element bends or deflects, causing the diaphragm to flex which expels a quantity of ink from a chamber through a nozzle. The flexing further draws ink into the chamber from a main ink reservoir through an opening to replace the expelled ink.

To attach an array of piezoelectric elements to pads or electrodes of a flexible printed circuit (flex circuit) or to a printed circuit board (PCB), a quantity (e.g., a microdrop) of conductor such as conductive epoxy, conductive paste, or another conductive material is dispensed individually on the top of each piezoelectric element. Electrodes of the flex circuit or PCB are placed in contact with each microdrop to facilitate electrical communication between each piezoelectric element and the electrodes of the flex circuit or PCB.

Achieving reliable electrical connections or interconnects between piezoelectric elements and a circuit layer becomes more challenging at increasing print head resolutions. Design constraints that require dimensionally smaller PZTs reduce both the surface area available for forming an electrical interconnect as well as the area for its surrounding bond adhesive, which can result in weaker electrical interconnects that may fail after stressing due, for example, to thermal cycling, thermal aging, and PZT actuations.

To operate a piezoelectric printhead, electrodes should be in contact with individual lead zirconate titanate (PZT) elements. In piezoelectric printhead with 600 DPI or 1200 DPI, either silver epoxy or bumped flex circuit is used to address individual PZT elements. As the resolution of the printhead increases, the area of individual PZT elements decreases. Therefore, the alignment of silver epoxy and bumped flex circuits to PZT elements will be more difficult. On the other hand, because the contact areas between silver epoxy or bumped flex circuits and individual PZT elements are large, the deflection of PZT is hindered.

What is needed, then, are improved high-density three-dimensional interconnection approach for piezoelectric printheads.

SUMMARY

In implementations, a method for forming an array of individual actuation elements having a three-dimensional electrical interconnection arrangement for a solid ink jet print head is disclosed. The method can include attaching a layer of piezoelectric material at a bottom surface to a top surface of a diaphragm layer, wherein the piezoelectric material is operable to actuate when subjected to a voltage; attaching a bottom surface of a first intermediate layer to a top surface of the piezoelectric material, wherein the first intermediate layer comprises one or more segmentable portions corresponding to the individual actuation elements and wherein each of the one or more segmentable portions comprises a void that is operable to function as a free space for portions of the piezoelectric material to actuate into when subjected to the voltage; attaching a bottom surface of a second intermediate layer to a top surface of the first intermediate layer, wherein the second intermediate layer comprises one or more segmentable portions corresponding to the one or more segmentable portions of the first intermediate layer; forming one or more vertical via holes near a corner position of each of the one or more segmentable portions of the first intermediate layer and the second intermediate layer to provide an electrical interconnect pathway between the top surface of the piezoelectric material, the top surface of first intermediate layer, and a top surface of the second intermediate layer; forming one or more electrically conductive pathways along the one or more vertical via holes comprising a microbump at a top surface of each of the one or more and electrically conductive pathways; and vertically separating a portion of the layer of piezoelectric material, the first intermediate layer, the second intermediate layer to form the array of individual actuation elements on the diaphragm layer.

In implementations, the first intermediate layer and the second intermediate layer can include material, such as, but not limited to, silicon or polyimide.

In implementations, the microbump can be formed using an electroplating process where the microbumps are patterned or defined using a photolithography process.

In implementations, the method can further include electroplating the microbump and the one or more vertical via holes through the top surface of the piezoelectric material.

In implementations, the method can comprise bonding layers of the actuation elements using a liquid adhesive material or a patterned B-stage adhesive film.

In implementations, a piezoelectric element array for a solid ink jet print head is disclosed. The array can include a piezoelectric element array comprising a plurality of piezoelectric elements, wherein each piezoelectric element is spaced from adjacent piezoelectric elements by an interstitial space, and wherein each piezoelectric element comprises a central void space formed in a first intermediate layer between the piezoelectric element array and a second intermediate layer that is operable to function as a free space for portions of the piezoelectric elements to actuate into when subjected to the voltage, and wherein each of the plurality of piezoelectric elements comprise one ore more electrodes formed in one or more via holes in the first intermediate layer and the second intermediate layer operable to provide an electrical interconnect pathway between a top surface of the piezoelectric material, a top surface of first intermediate layer, and a top surface of the second intermediate layer.

In implementations, the first intermediate layer and the second intermediate layer can include material such as, but not limited to, silicon or polyimide.

In implementations, the electrical interconnect pathway can be electroplated and can include a microbump at a top surface of the electrical interconnect pathway.

In implementations, the first intermediate layer and the second intermediate layer can comprise an inorganic material, such as, silicon, or an organic material, such as, a polymer, such as, a polyimide.

In implementations, the electrical interconnect pathway can be electroplated and can include microbumps at a top surface of the electrical interconnect pathway.

In implementations, an ink jet printer is disclosed and can comprise an ink jet printhead, comprising: a piezoelectric element array comprising a plurality of piezoelectric elements, wherein each piezoelectric element is spaced from adjacent piezoelectric elements by an interstitial space, and wherein each piezoelectric element comprises a central void space formed in a first intermediate layer between the piezoelectric element array and a second intermediate layer that is operable to function as a free space for portions of the piezoelectric elements to actuate into when subjected to the voltage, and wherein each of the plurality of piezoelectric elements comprise one ore more electrodes formed in one or more via holes in the first intermediate layer and the second intermediate layer operable to provide an electrical interconnect pathway between a top surface of the piezoelectric material, a top surface of first intermediate layer, and a top surface of the second intermediate layer. a circuit layer attached to the standoff layer and comprising a plurality of conductive pads attached to the plurality of piezoelectric elements through the plurality of openings; and an ink path through the ink jet print head; and a printer housing which encases at least one ink jet print head.

In implementations, the first intermediate layer and the second intermediate layer can comprise material selected from the group of: silicon and polyimide.

In implementations, the electrical interconnect pathway can be electroplated and can include a microbump at a top surface of the electrical interconnect pathway.

In implementations, the ink jet printer can further comprise a heater operable to heat a solid ink stored in the ink jet printhead to a desired temperature to provide the solid ink in a form suitable for printing with the ink jet printer.

In implementations, the piezoelectric element array can be operable to eject a predetermined amount of ink stored in the ink jet print head when subjected to an actuating voltage.

In implementations, the ink can be a solid ink or an aqueous ink.

DESCRIPTION OF DRAWINGS

The accompanying drawings, which are incorporated in and constitute a part of this specification, illustrate implementations of the present teachings and together with the description, serve to explain the principles of the present teachings.

DETAILED DESCRIPTION

Reference will now be made in detail to exemplary embodiments of the present teachings, examples of which are illustrated in the accompanying drawings. Wherever possible, the same reference numbers will be used throughout the drawings to refer to the same or like parts.

In general, implementations of the present disclosure relate to a high-density three-dimensional interconnection designed to avoid the previously mentioned drawbacks of current designs. The high-density three-dimensional interconnect approach can be used in printheads using a variety of ink types including solid ink and aqueous ink. Firstly, an implementation may only use the least deflected area of the PZT element, i.e. the corners, for the electrical interconnections, leaving the area with larger deflection area unaffected. Secondly, an implementation may use through holes on the packaging layer for electroplated three-dimensional electrodes. The packaging layer can have the function of both mechanically bonding the PZT elements and electrically addressing the PZT elements.

As used herein, unless otherwise specified, the word "printer" encompasses any apparatus that performs a print outputting function for any purpose, such as a digital copier, bookmaking machine, facsimile machine, a multi-function machine, electrostatographic device, etc. Unless otherwise specified, the word "polymer" encompasses any one of a broad range of carbon-based compounds formed from long-chain molecules including thermoset polyimides, thermoplastics, resins, polycarbonates, epoxies, and related compounds known to the art.

An embodiment of the present teachings can result in a more robust physical connection between the circuit layer and the PZT array, and may result in decreased stresses on the interconnection which electrically couples the PZT to the circuit layer.

Figure 1:
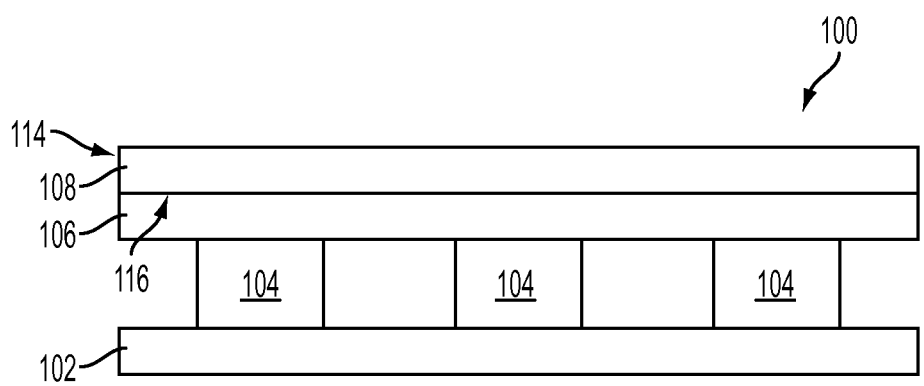
FIG. 1 shows an example partial perspective view of an actuator assembly according to implementations of the present disclosure.

FIG. 1 illustrates a partial perspective view of an actuator assembly 100, according to an embodiment. It should be readily apparent to one of ordinary skill in the art that the system depicted in FIG. 1 represents a generalized schematic illustration and that other components/devices can be added, removed, or modified.

Referring to FIG. 1, actuator assembly 100 may be configured for use in a print head of an inkjet printer. More particularly, the actuator assembly 100 may be disposed adjacent an ink path or chamber and/or a nozzle plate, such that the actuator assembly 100 is capable of ejecting ink from the chamber and/or path, through nozzles in the nozzle plate, as well as drawing the ink into the chamber and/or path for the next round of ejection.

Actuator assembly 100 may generally include a plurality of layers, which may be stacked, one on top of the other in a generally parallel arrangement. For example, actuator assembly 100 may include diaphragm 102, array of actuators 104, standoff layer 106, and flexible printed circuit 108.

Diaphragm 102 may be constructed of one or more metals such as titanium, nickel, or a metal alloy, for example a metal alloy having a coefficient of thermal expansion (CTE) of between about 3 micrometers per meter for each degree Celsius (ppm/° C.) and about 16 ppm/° C., or a dielectric such as silicon nitride. Further, diaphragm 102 may be generally flexible, such that diaphragm 102 is configured to deflect during use of actuator assembly 100, so as to eject ink through the nozzle.

Array of actuators 104 can be disposed generally adjacent to diaphragm 102, and can be coupled thereto. Actuators 104 can include one or more piezoelectric transducers configured to deflect when an electrical current is applied thereto. Deflection of actuators 104 may cause adjacent portions of diaphragm 102 to correspondingly deflect. It will be appreciated that actuator assembly 100 may include any number of actuators 104, for example, tens, hundreds, thousands, or more, separated by any suitable distance. In implementations, the PZT material can be diced into small tiles to create individual or independent actuators. In other implementations, the PZT is not diced into small tiles, but remains on the same piece of PZT material. As such, each actuator is operable to actuate a small part of the PZT material.

Standoff layer 106 may be disposed generally adjacent array of actuators 104, with array of actuators 104 being disposed between diaphragm 102 and standoff layer 106. Standoff layer 106 may be constructed at least partially from silicon dioxide, SU-8 photoresist, another type of dielectric material, combinations thereof, and/or the like. In some embodiments, standoff layer 106 may exhibit adhesive properties, so as to bond to array of actuators 104, for example. In such embodiments, standoff layer 106 may be constructed, at least partially of, a silicone compound such as dialkyl silicone, wherein the alkyl groups can be chosen from $C_1$ to $C_4$ alkyls, such as methyl and ethyl. For example, the dialkyl silicone can be dimethyl silicone. In other embodiments, standoff layer 106 can exhibit substantially no, or at least negligibly little, adhesive properties, such additional adhesives and/or other fastening devices, processes, etc. may be employed to maintain the position of standoff layer 106 with respect to array of actuators 104.

Flexible printed circuit 108 may include body having top side 114 and bottom side 116, with bottom side 116 facing generally toward diaphragm 102. It will be appreciated that "top," "bottom," "up," "down," "left," "right," as well as any other directional terms, are intended merely as a convenient way to refer to relative relationships between components as illustrated in the Figures provided herein, and is not intended to be limiting on the orientation relative an absolute plane. Moreover, flexible printed circuit 108 may be a metallized electrical interconnect layer, for example, with body being generally formed from a layer of polyimide, and having conductive traces formed therein, which may be coupled with contact pads. The traces may extend along bottom side 116 of body, and may be coupled with a power source via an application specific integrated circuit (ASIC), another type of integrated circuit, and/or the like. Moreover, the traces and/or contact pads may be formed from gold, silver, copper, combinations thereof, and/or any other electrically conductive element. Further, the traces and contact pads may be formed form the same or different materials.

Figure 2:
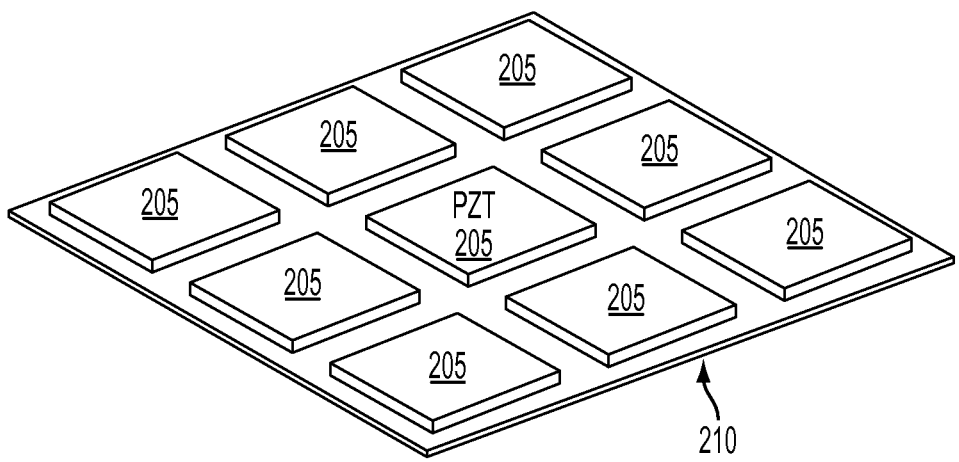
FIG. 2 shows an example isometric view of a 3 by 3 PZT array on the top of a stainless steel diaphragm according to implementations of the present disclosure.

FIG. 2 shows an isometric view of a 3 by 3 PZT array on the top of a stainless steel diaphragm. It should be readily apparent to one of ordinary skill in the art that the system depicted in FIG. 2 represents a generalized schematic illustration and that other components/devices can be added, removed, or modified.

Referring to FIG. 2, the actuation part of a piezoelectric printhead includes a large amount of parallelogram PZT segments 205. Although FIG. 2 shows a 3 by 3 PZT array, it will be appreciated that a larger array including hundreds or thousands of piezoelectric elements can be formed. For example, print heads may have a 344×20 array of piezoelectric elements 205. To eject an ink droplet, a voltage needs to be applied on both the top and the bottom sides of a corresponding PZT segment 205. To operate the printhead, it is necessary to electrically address a large amount of PZT segments 205 individually. Diaphragm 210, for example a conductive stainless steel diaphragm, can be used as a common (i.e. bottom) electrode to all the PZT segments 205. Different approaches can be used to make electrical connections to the top side of PZT, i.e., silver epoxy and bumped flex circuit.

Figure 3:
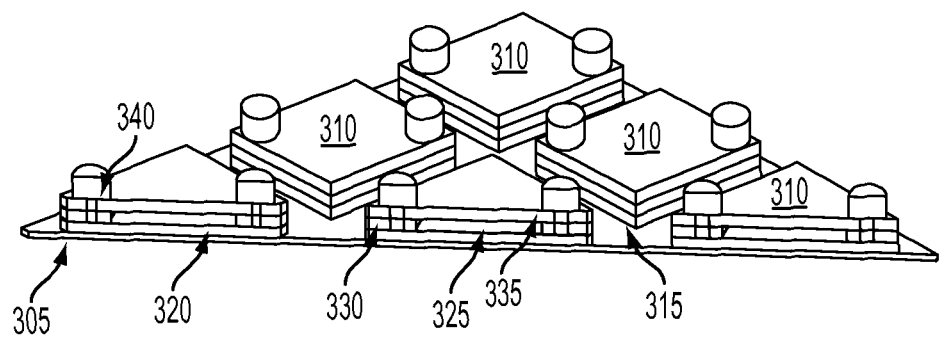
FIG. 3 shows an example isometric with cross-sectional view of an embodiment of three-dimensional electrical interconnections according to implementations of the present disclosure.

FIG. 3 shows an example isometric cross-sectional view of an embodiment of three-dimensional electrical interconnections for use in an actuation element for a solid inkjet printhead in accordance with implementations of the present disclosure. It should be readily apparent to one of ordinary skill in the art that the system depicted in FIG. 3 represents a generalized schematic illustration and that other components/devices can be added, removed, or modified.

Referring to FIG. 3, the actuation portion of the piezoelectric printhead includes diaphragm layer 305 that is operable to support one or more individual actuation elements 310. If more than one individual actuation element is present, they can be arranged on diaphragm layer 305 in a predetermined pattern having a uniform spacing or interstitial space 315 between individual actuation elements. The arrayed pattern of individual actuation elements 310 can be provided to and attached to a top surface of diaphragm layer 305. Each individual actuation element 310 comprises a layered structure in a generally rectangular configuration. Other geometric configurations of actuation elements can also be used. The base of each individual actuation element, which is closest to diaphragm layer 305, comprises a layer of piezoelectric material 320. Void 325 or cavity can be provided above a top surface of piezoelectric material 320. Void 325 or cavity provides a deflection cavity for a portion of piezoelectric material 320 to actuate or deflect into when subjected to a proper voltage. Void 325 can be provided by first intermediate or packaging layer 330 having a precut section removed from around a center section of package layer 330. Second intermediate or package layer 335 can be provided and attached to package layer 330. Although FIG. 3 shows only two package layers 330 and 335, additional package layers can be provide so long as void 325 is provide adjacent to piezoelectric material to create the deflection cavity.

By way of a non-limiting example, package layer 330 and 335 can include inorganic material, e.g., silicon (Si), and organic material, e.g., polymer, one example of which is polyimide. Each layer, including diaphragm layer 305, piezoelectric material 320, package layer 330, and package layer 335, can be bonded to each other using a variety of techniques. For example, layers can be bonded by applying a liquid adhesive layer, e.g., SU-8 or SU 8, which is an epoxy-based negative type photoresist that can be used for wafer-level MEMS packaging, or a patterned B-stage adhesive film, e.g., a thermal plastics such as Bonding Film 406, which is a flexible, light colored, thermoplastic adhesive bonding film that has good adhesion to a variety of substrates, including metals, and is sold by 3M with headquarters in St. Paul, Minn. For the liquid adhesive, the layers can be bonded by applying heat and pressure to cure the adhesive. For the thermal plastics, heat and pressure is applied to cure the adhesive. For example, the amount and duration of applying the heat and/or pressure is such that the thermal plastic melts to make it stick to the top and bottom of the surfaces that are to be bonded, but no so high in temperature, e.g., at or above 200° C., that the PZT material loses its function.

Each individual actuation element 310 includes one or more conductive members 340, for example, plated electrodes and/or microbumps vertically formed through each layer, including diaphragm layer 305, piezoelectric material 320, package layer 330, and package layer 335, to provide an electrical pathway from piezoelectric material 320 to circuitry (not shown) formed on a top surface of the actuation portion of the printhead.

The three-dimensional arrangement of electrical interconnections, shown in FIG. 3 and described further below, can provide a number of advantages over conventional arrangements. For example, by providing the three-dimensional electrical interconnections having package layer(s) 330 and/or 335 attached to or bonded on the top of the individual piezoelectric segments 310, larger diameter cavities or voids in package layer 330 and/or 335 can be achieved, which save free space for the deflection of the piezoelectric segments 310. The contact area between the piezoelectric segments 310 and package layer(s) 330 and/or 335 corresponds to piezoelectric segments 310 with the least deflection. Also, smaller diameter vias, for example, about a few micrometers in size, in package layer(s) 330 and/or 335, can formed and plated through the metal layer on the top of the piezoelectric segments 310. The plated metal on the top of package layer(s) 330 and/or 335 can be defined either during or after the plating process to form more complicated circuitry or to connect directly to external circuits. In the embodiment shown in FIG. 3, there are two circular electrodes in through holes for each PZT segment 310. This design can be generalized to one or a plurality of electrodes with different shapes.

Figure 4A:
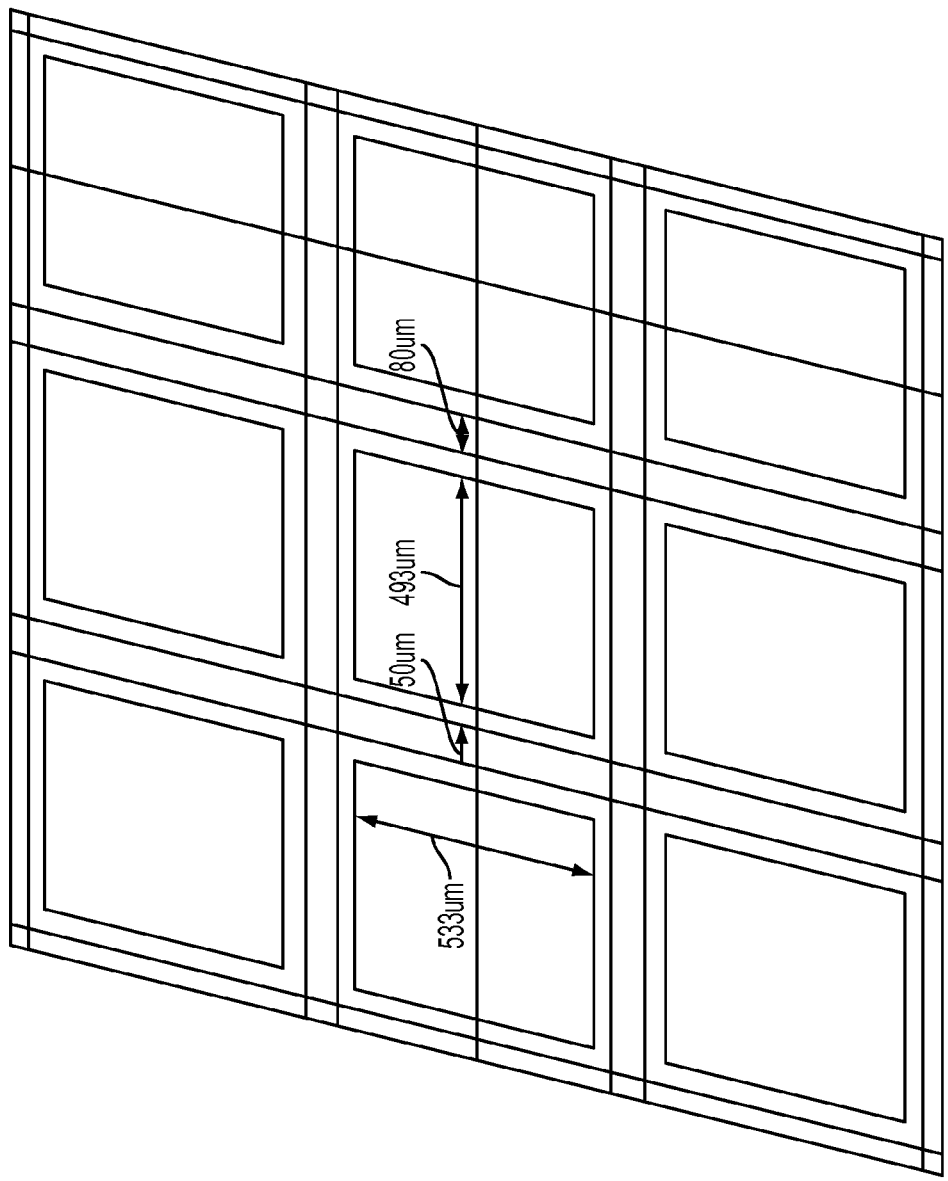
FIG. 4. (a) shows an example modeling structure, (b) horizontal deflection vs. diagonal deflection, and (c) the comparison between the deflection with PZT on a stainless steel diaphragm and the deflection of the structure shown in FIG. 3 under the same driving conditions according to implementations of the present disclosure.
Figure 4B:
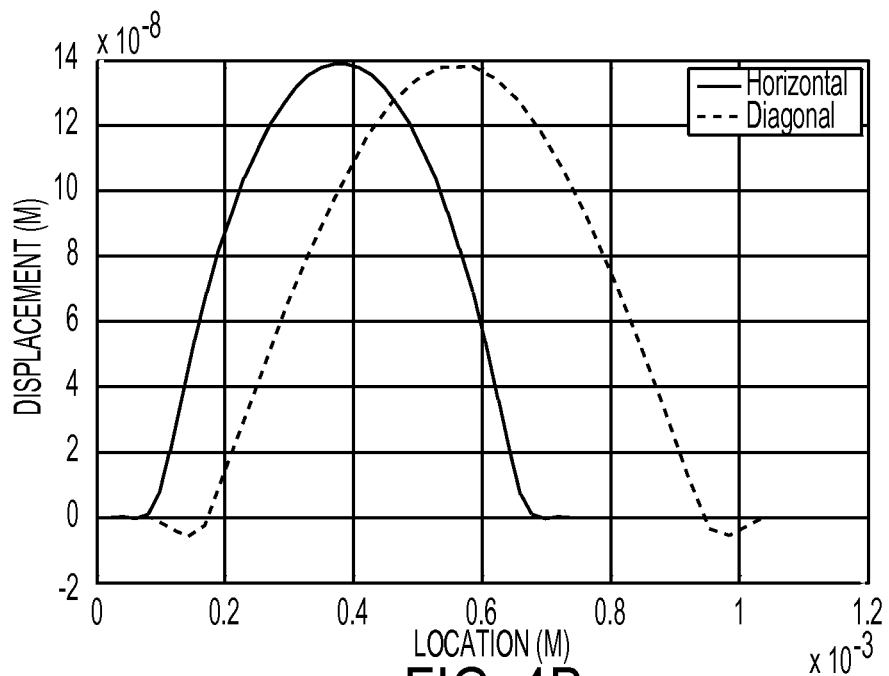
Figure 4C:
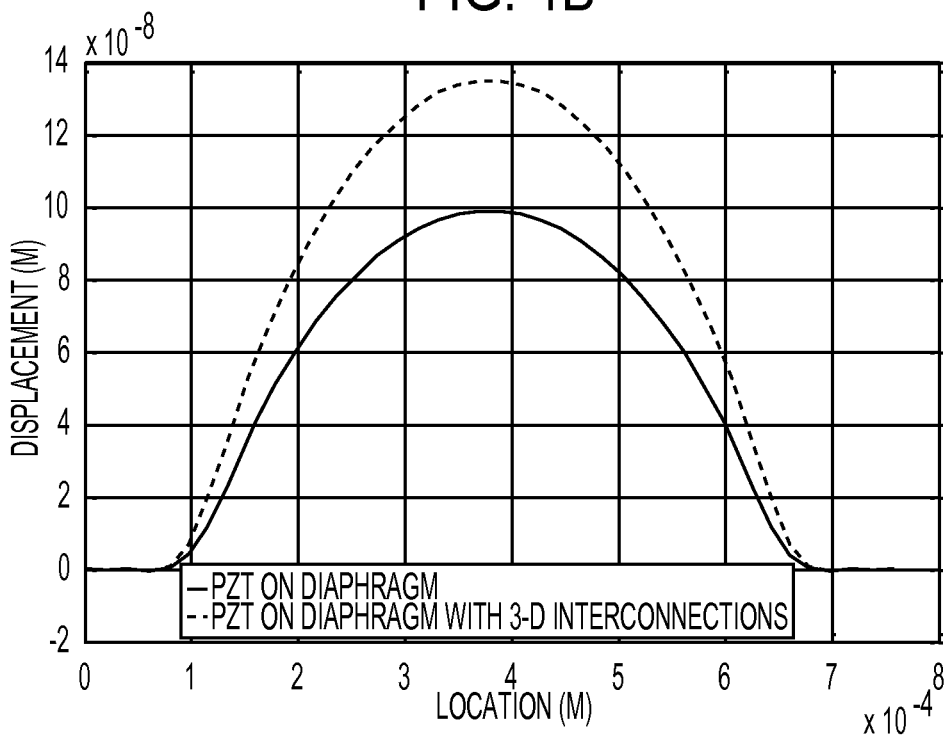
Figure 5A:
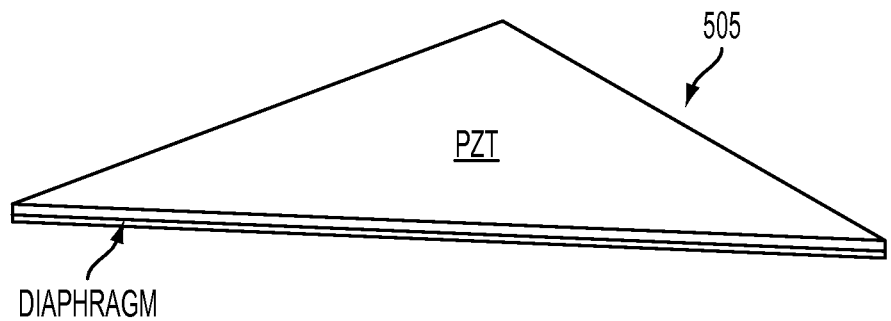
FIG. 5 shows an example process of fabricating three-dimensional electrical interconnections as shown in FIG. 3.
Figure 5B:
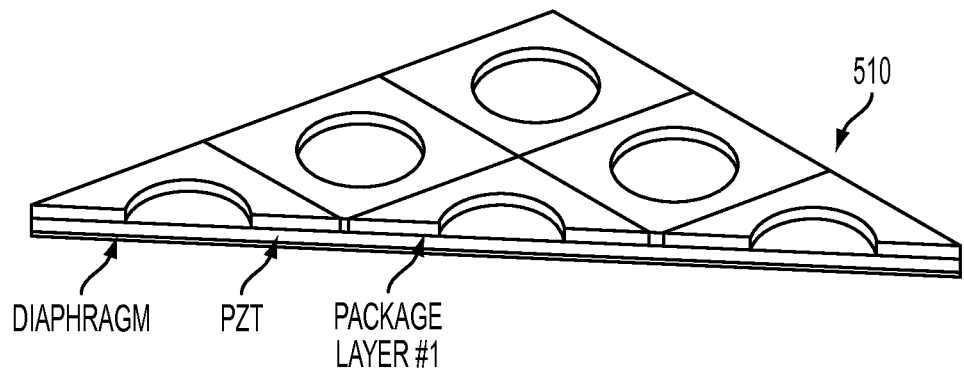
Figure 5C:
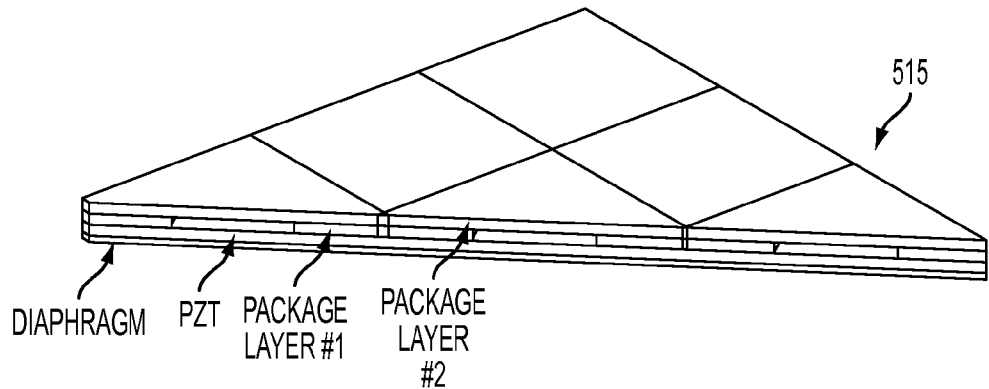
Figure 5D:
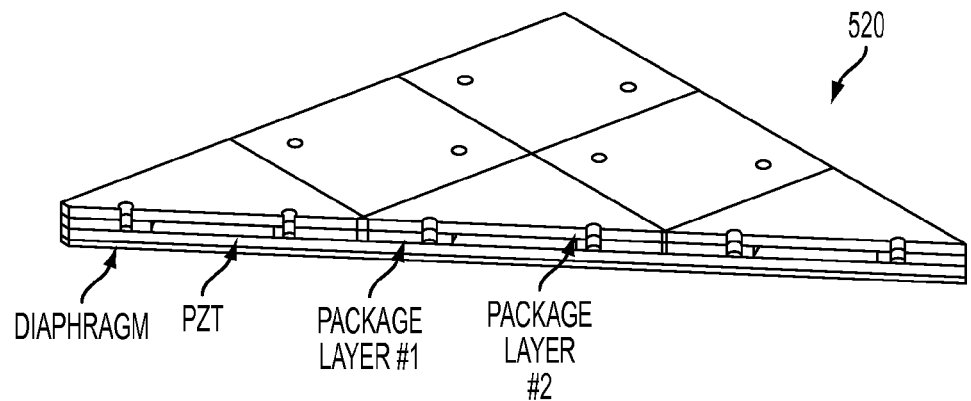
Figure 5E:
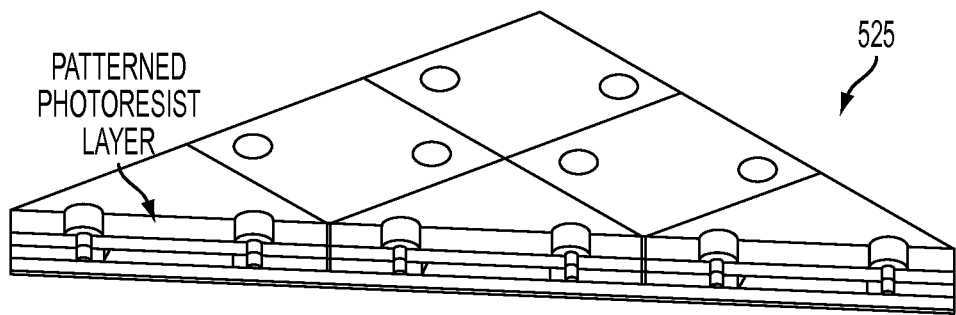
Figure 5F:
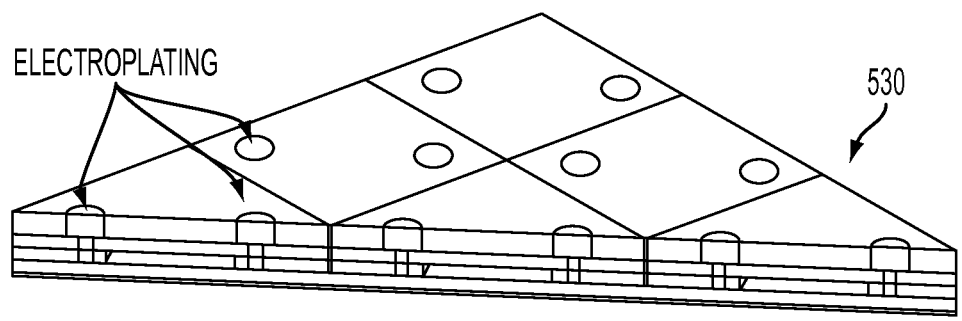
Figure 5G:
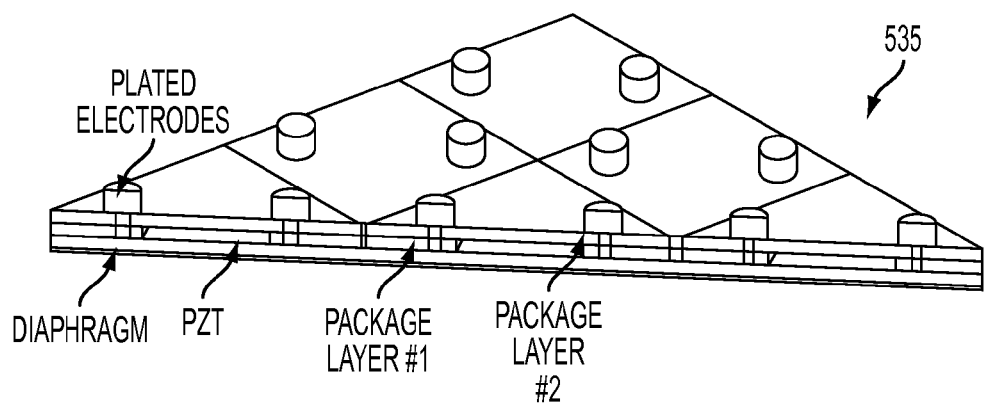
Figure 5H:
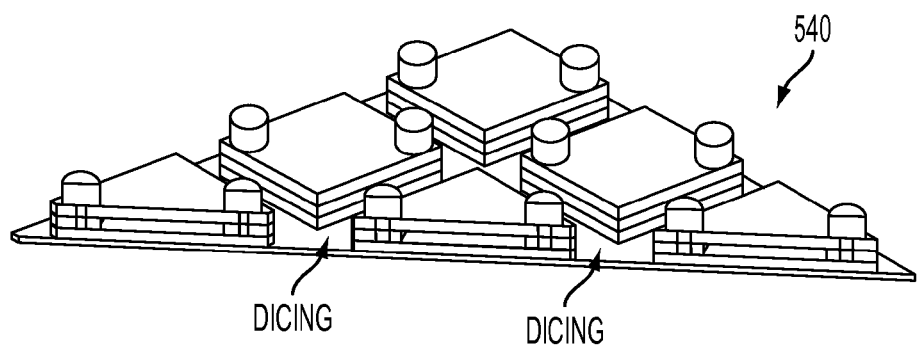

FIG. 4(*a*) shows an example modeling structure for the structure shown in FIG. 3. FIG. 4(*b*) shows the modeled horizontal deflection vs. diagonal deflection for the model of FIG. 4(*a*). FIG. 4(*c*) shows the comparison between the deflection with the piezoelectric elements on a stainless steel diaphragm and the deflection of the structure shown in FIG. 3 under the same driving conditions.

Numerical modeling was conducted by the inventors to ensure the performance of the structure shown in FIG. 3. FIG. 4(*a*) shows one design of piezoelectric dimension. With such design, the horizontal and diagonal deflection with 40 V applied on the center piezoelectric segment is shown in FIG. 4(*b*). It can be concluded that corners have larger area with small deflections. Therefore, it is advantageous to place the three-dimensional electrical connections in the corner area. FIG. 4(*c*) compares the deflections between a structure of piezoelectric elements on the top of a stainless steel diaphragm and the structure shown in FIG. 3, with a circular cavity (diameter=440 micrometers). It can be concluded that the packaging layer(s) and electrodes decrease the deflection of the piezoelectric elements, but to a limited amount. The geometry and dimension of the packaging layer can be optimized to maximize the piezoelectric deflection.

The advantages of the design as shown in FIG. 3 include the ability to achieve high densities, because the electrode in contact with the PZT top surface can as small as a few micrometers. This allows it to be used for higher density printheads, such as 1200 DPI and 2400 DPI printheads. Moreover, the cavity in the packaging layer(s) allows maximum PZT deflections. The electrode geometry on the top packaging layer surface can be flexibly designed to accommodate different external circuit interfaces.

FIG. 5 shows an example fabrication process for the three-dimensional electrical interconnections as shown in FIG. 3. At 505, a layer of piezoelectric material or PZT, at a bottom surface, can be attached to or bonded with a top surface of a diaphragm layer. The piezoelectric material is operable to actuate when subjected to a voltage. At 510, a bottom surface of a first intermediate layer can be attached to or bonded with a top surface of the piezoelectric material. The first intermediate layer can comprise one or more segmentable portions corresponding to the individual actuation elements. Each of the one or more segmentable portions can comprise a cavity or a void that is operable to create and deflection cavity and function as a free space for portions of the piezoelectric material to actuate into when subjected to the voltage. At 515, a bottom surface of a second intermediate layer can be attached to or bonded with a top surface of the first intermediate layer. The second intermediate layer comprises one or more segmentable portions corresponding to the one or more segmentable portions of the first intermediate layer. At 520, one or more vertical via holes can be formed, for example, by an etching process, near a corner position of each of the one or more segmentable portions of the first intermediate layer and the second intermediate layer to provide an electrical interconnect pathway between the top surface of the piezoelectric material, the top surface of first intermediate layer, and a top surface of the second intermediate layer. The etching process stops at the PZT top surface. At 525, a photoresist layer is provided to a top surface of the second intermediate or packaging layer having a pattern with opening for holes for microbump formation. At 530, one or more electrically conductive pathways can be formed along the one or more vertical via holes comprising a microbump at a top surface of each of the one or more and electrically conductive pathways. For example, the electrical interconnect pathway can be formed by an electroplating process where one or more metals can be used to form electrical connections from the top surface of the piezoelectric layer to the top of the packaging layers. At 535, the photoresist layer is removed. At 540, the layer of piezoelectric material, the first intermediate layer, the second intermediate layer can be vertically separated or diced with a saw or similar cutting tool to form or singulate the array of individual actuation elements on the diaphragm layer.

Figure 6:
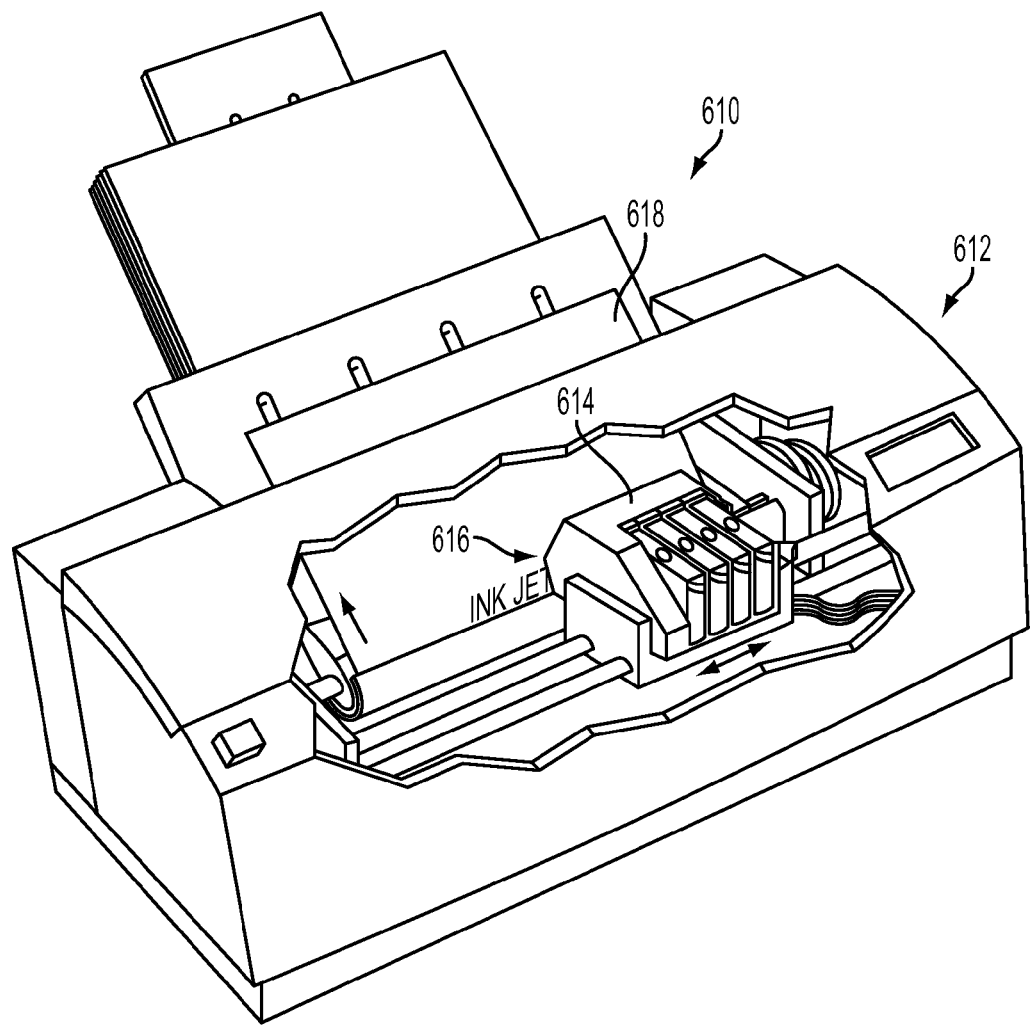
FIG. 6 depicts an example printer according to implementations of the present disclosure.

After completing the print head, one or more print heads according to an embodiment of the present teachings can be installed into a print device. FIG. 6 depicts a printer 610 including a printer housing 612 which encases at least one print head 614 including a plurality of supports in accordance with the present teachings as discussed above. During operation of the printer 610, ink 616 is ejected from the one or more print heads 614. Each print head 614 is operated in accordance with digital instructions to create a desired ink image 616 on a print medium 618 such as a paper sheet, plastic, etc. Each print head 614 may move back and forth relative to the print medium 618 in a scanning motion to generate the printed image swath by swath. Alternately, each print head 614 may be held fixed and the print medium 618 moved relative to it, creating an image as wide as the print head 614 in a single pass. Each print head 614 can be narrower than, or as wide as, the print medium 618. In another embodiment, each print head 614 can print to an intermediate surface such as a rotating drum or belt (not depicted for simplicity) for subsequent transfer to a print medium.

The present disclosure is not to be limited in terms of the particular implementations described in this application, which are intended as illustrations of various implementations. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that the terminology used herein is for the purpose of describing particular implementations only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

Modern image processing and image analysis concern statistical likelihoods more than absolutes. They are statistical efforts to produce a desired state and/or result. Accordingly, no limitation in the description of the present disclosure or its claims can or should be read as absolute. The limitations of the claims are intended to define the boundaries of the present disclosure, up to and including those limitations. To further highlight this, the term "substantially" may occasionally be used herein in association with a claim limitation (although consideration for variations and imperfections is not restricted to only those limitations used with that term). While as difficult to precisely define as the limitations of the present disclosure themselves, we intend that this term be interpreted as "to a large extent", "as nearly as practicable", "within technical limitations", and the like.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or embodiments of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a workpiece, regardless of the orientation of the workpiece. The term "horizontal" or "lateral" as used in this application is defined as a plane parallel to the conventional plane or working surface of a workpiece, regardless of the orientation of the workpiece. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the workpiece, regardless of the orientation of the workpiece.

While various aspects and implementations have been disclosed herein, other aspects and implementations will be apparent to those skilled in the art. The various aspects and implementations disclosed herein are for purposes of illustration and are not intended to be limiting, with the true scope and spirit being indicated by the following claims.

What is claimed is:

1. A piezoelectric element array attached to a diaphragm for an ink jet print head, comprising:
   a diaphragm configured to eject ink during deflection of the diaphragm, wherein the diaphragm comprises a first side and a second side opposite the first side;
   a piezoelectric element array comprising a plurality of piezoelectric elements overlying the first side of the diaphragm, wherein each piezoelectric element is spaced from adjacent piezoelectric elements by an interstitial space and each piezoelectric element comprises:
      a piezoelectric layer overlying the first side of the diaphragm and configured to deflect the diaphragm in response to a voltage;

a first intermediate layer, wherein a portion of the piezoelectric layer is interposed directly between the diaphragm and the first intermediate layer;

a second intermediate layer, wherein a portion of the first intermediate layer is interposed directly between the piezoelectric layer and the second intermediate layer;

a central void space defined in part by the first intermediate layer and located between a surface of the piezoelectric layer and a surface of the second intermediate layer, wherein the central void space is operable to function as a free space for a portion of the piezoelectric layer to actuate into when subjected to the voltage;

at least one via hole that extends through the second intermediate layer and the first intermediate layer; and at least one electrode formed in the at least one via hole, wherein the at least one electrode is operable to provide an electrical interconnect pathway between the piezoelectric layer and a top surface of the second intermediate layer through first intermediate layer.

2. The piezoelectric element array attached to the diaphragm according to claim 1, wherein the first intermediate layer and the second intermediate layer comprises an inorganic material.

3. The piezoelectric element array attached to the diaphragm according to claim 2, wherein the inorganic material includes silicon.

4. The piezoelectric element array attached to the diaphragm according to claim 1, wherein the first intermediate layer and the second intermediate layer comprises an organic material.

5. The piezoelectric element array attached to the diaphragm according to claim 4, wherein the organic material includes a polymer.

6. The piezoelectric element array attached to the diaphragm according to claim 5, wherein the polymer includes polyimide.

7. The piezoelectric element array attached to the diaphragm according to claim 1, wherein the electrical interconnect pathway is electroplated and includes microbumps at a top surface of the electrical interconnect pathway.

8. The piezoelectric element array attached to the diaphragm according to claim 1, wherein each piezoelectric element further comprises four corners and at least two of the electrodes, wherein each of the two electrodes is located in one of the four corners.

* * * * *